SIMULTANEOUS-TO-SERIAL PERMUTATION CODE CONVERTER

Filed May 7, 1956 3 Sheets-Sheet 1

INVENTOR.
F.J.GAFFNEY
C.A.WESLEY
C.P.BUKOWSKI
BY
[signature]
ATTORNEY

SIMULTANEOUS-TO-SERIAL PERMUTATION CODE CONVERTER

Filed May 7, 1956 3 Sheets-Sheet 2

INVENTOR.
F.J.GAFFNEY
C.A.WESLEY
C.P.BUKOWSKI

BY

ATTORNEY

INVENTOR.
F.J.GAFFNEY
C.A.WESLEY
C.P.BUKOWSKI
BY
ATTORNEY

United States Patent Office 2,968,693

Patented Jan. 17, 1961

2,968,693

SIMULTANEOUS-TO-SERIAL PERMUTATION CODE CONVERTER

Francis J. Gaffney, Westport, Charles A. Wesley, Ridgefield, and Charles P. Bukowski, Cos Cob, Conn., assignors to The Teleregister Corporation, Stamford, Conn., a corporation of Delaware Filed May 7, 1956, Ser. No. 583,283

3 Claims. (Cl. 178—53.1)

This invention relates primarily to electronic telegraph signal transmitting distributors, and more particularly to so-called start-stop electronic distributors for transmitting permuted code groups of pulses of two signal conditions to a sending circuit with each group of code pulses preceded by a start pulse of one of said signal conditions and terminated by a stop or rest pulse of the other of said signal conditions.

It is one of the objects of the present invention to provide an electronic start-stop telegraph signal distributor of the above type employing a minimum number of control circuits and components and which is highly reliable and stable in operation.

Another object of the present invention is to provide an electronic start-stop distributor employing a counting tube such as a magnetron beam switching tube as the distributing means. In this connection it is a further object of the present invention to provide improved and highly efficient control circuits for the counting or magnetron beam switching tube.

Normally in start-stop systems, the start pulse preceding each group of permuted intelligence pulses is of the same length as the following individual intelligence pulses, and the rest pulse terminating each code group varies in length and approaches a minimum length in the neighborhood of one and a half times the length of the other pulses. In this connection it is a further object of the invention to provide an electronic distributor for generating start-stop telegraph signals wherein the length of the pulses is determined by an electronic oscillator circuit and in such a manner that the rest pulse is substantially precisely one and a half times the length of the other pulses. In this respect a more specific object of the invention is to provide an improved electronic gated multivibrator control circuit stabilized by an electronic oscillator circuit for advancing the count along the counting tube.

Still another object of the invention is to provide an arrangement whereby the control of the multivibrator by the oscillator can be disabled and the distributor readily adapted to transmit rest pulses of other than one and a half times the length of the intelligence pulses.

Still another object of the invention is to provide an electronic distributor incorporating the above features and which can readily be adapted to operate at different speeds, as for example, sixty, seventy-five, or a hundred words per minute.

The above and other features and objects of the present invention of providing an improved electronic distributor will be more apparent in the following detailed description thereof wherein reference is made to the accompanying drawings, in the latter of which:

Figure 1:
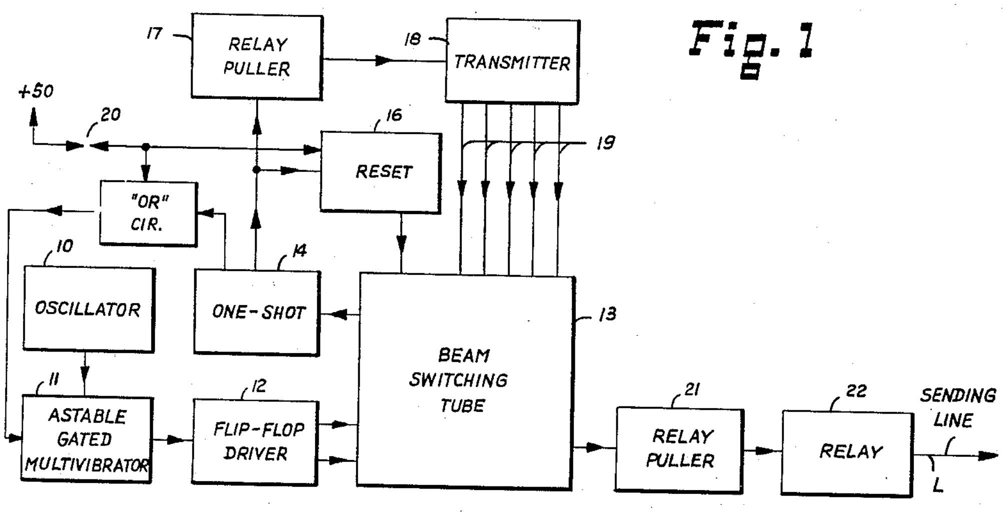
Fig. 1 is a block diagram showing the various building blocks or units comprising a complete distributor of the present invention.

Referring now to the block diagram of Fig. 1, an electronic oscillator 10 stabilizes an astable gated multivibrator 11 which controls a flip-flop driver 12, the two outputs of which are connected to alternate control or advancing grids of the magnetron beam switching or counting tube 13, such as for example, a Burroughs-Haydu Type 6700. The application of the out-of-phase outputs of the flip-flop driver 12 to the counting tube advances the count along the serial positions of the tube until at the proper count corresponding to the beginning of the rest pulse or when the beam reaches the number "7" position of the tube for a seven and a half unit code, a one-shot multivibrator 14 is triggered.

The one-shot multivibrator 14 controls a reset circuit 16 which operates to cause the beam of the counter tube 13 to return to its "0" position and the counting operation of the tube begins another cycle of operation. In addition to the above, the one-shot multivibrator pulses a relay puller 17 which controls a transmitting device 18, such as a tape transmitter or rotary switch, to set up a new code group and apply the same by means of five individual circuits 19 to individual targets of the counting tube 13. As the count in the tube 13 advances from one position to another, a train of pulses corresponding to the code group is applied to a relay puller 21 driving a polar relay 22 transmitting to a sending line L. Each train of intelligence pulses is preceded by a unit length start pulse and normally followed by a one and a half unit length rest pulse. At the end of a message contacts 20 close and through the operation of the "or" circuit stop the astable gated multivibrator until the contacts 20 are opened at the beginning of the next message.

Figure 3:
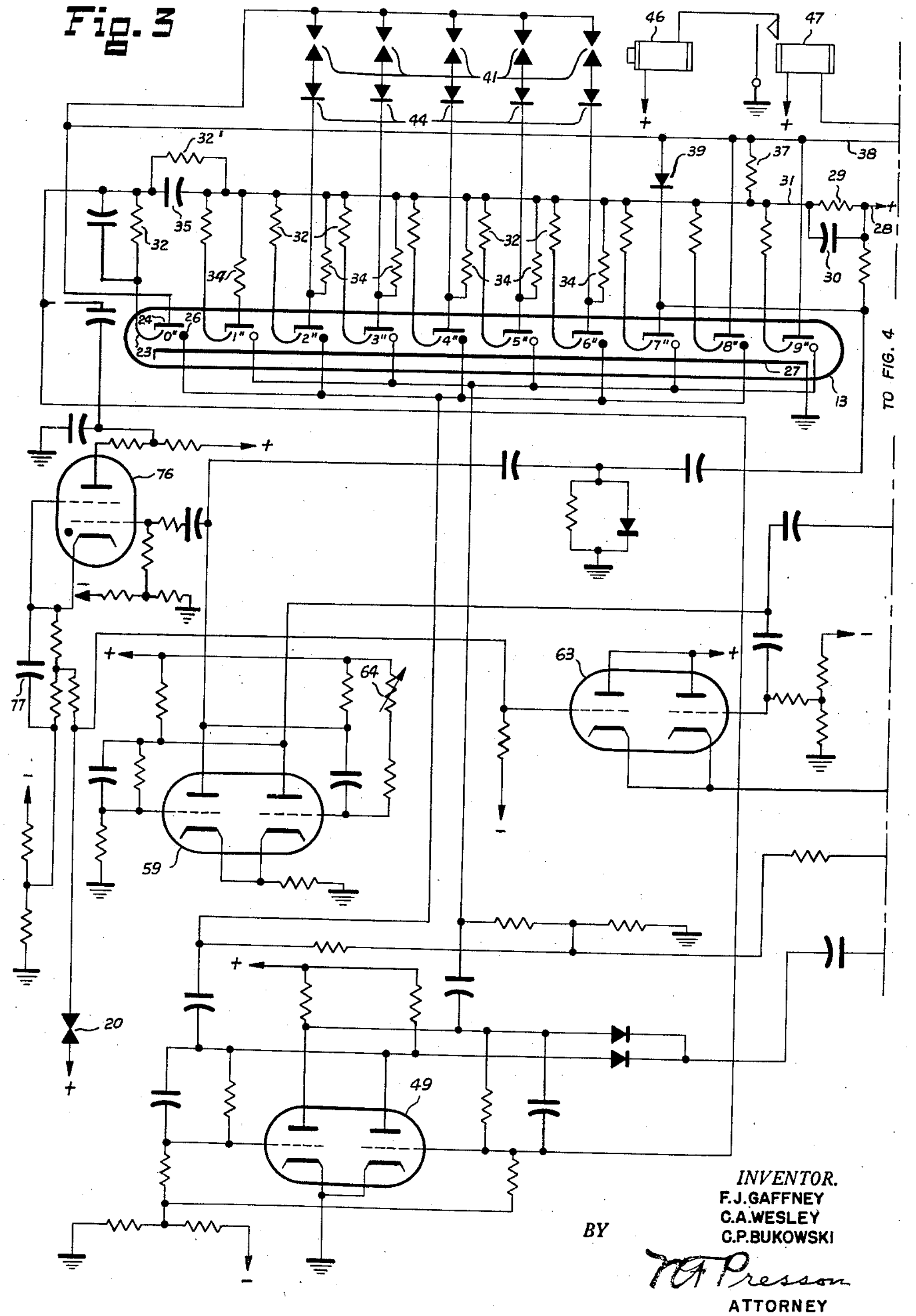
Figs. 3 and 4 are detailed circuit drawings of the preferred form of the distributor.
Figure 4:
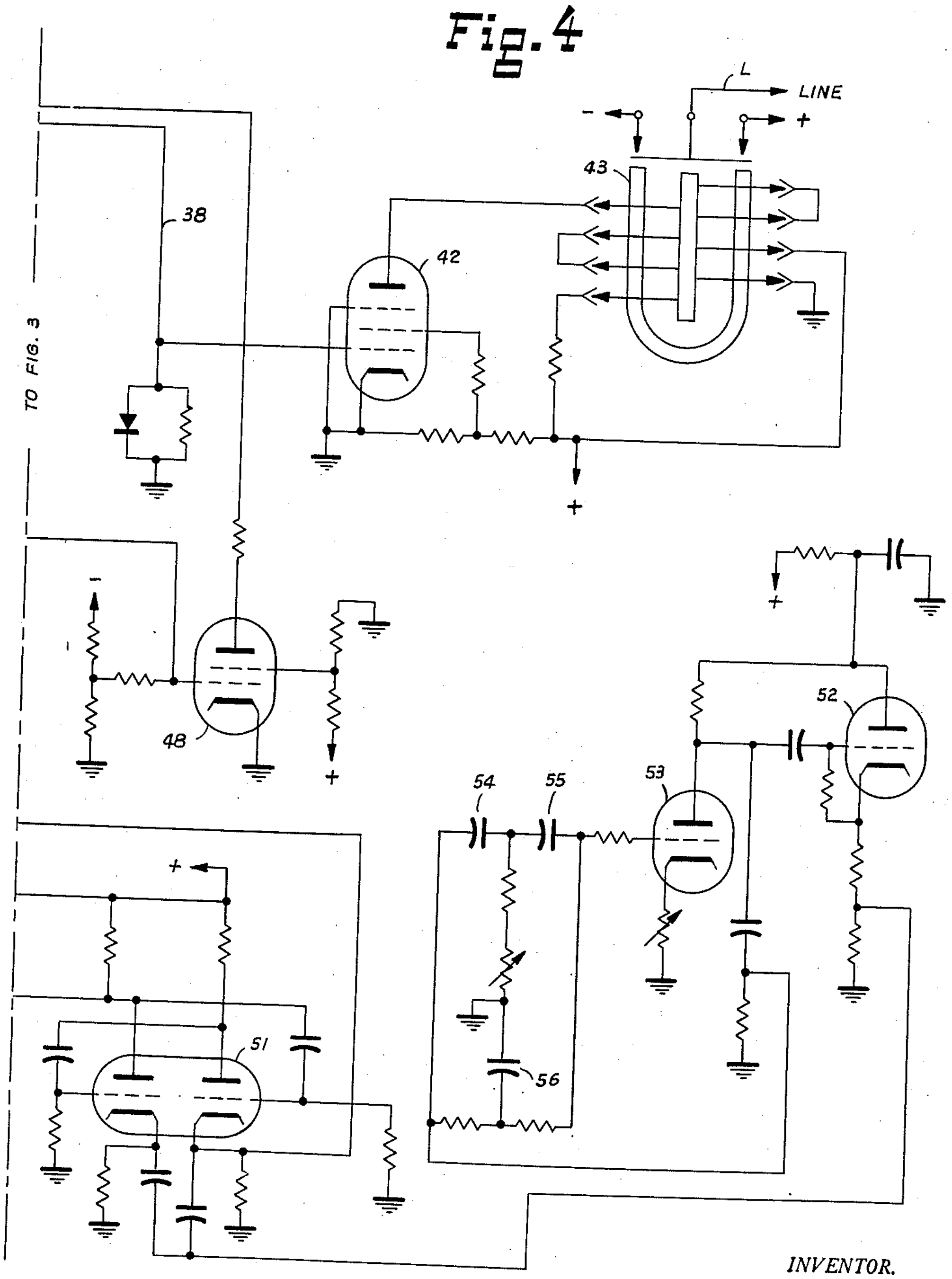

Referring now to the detail circuit drawings, Figs. 3 and 4, the magnetron beam switching or counting tube 13 disclosed has ten positions numbered consecutively from "0" to "9," and each position of the tube consists of three basic electrodes, namely, a spade 23, a target or output plate 24, and a switching or control grid 26. Although the ten positions are shown in the drawings in a row, they are actually arranged in a circle about a common cathode 27, and as will be obvious hereinafter, various other types of counter tubes could be employed.

Positive potential at 28 is applied through a limiting resistor 29 shunted by a capacitor 30, to a conductor 31 which is connected through individual resistors 32 to the spades 23 of the "1" to "9" positions of the switching tube 13. For resetting purposes the spade circuit of the "0" position also includes a small resistor 32' shunted by a capacitor 35. By way of example only, the potential 28 may be 150 volts and the resistors 29 and 32 may be 8200 and 150,000 ohms respectively, and the recited values as well as those of other resistors and capacitors shown in the drawings and hereinafter mentioned may vary according to the design and particular application to which the system is applied. The targets 24 of tube positions "1" through "6" are connected to conductor 31 through 8200 ohm resistors 34. A common load resistor 37 of 8200 ohms connects conductor 31 to conductor 38, and the latter is connected directly to the targets 24 of tube positions "0," "8" and "9" and through a diode 39 to the target of tube position "7." Conductor 38 is also connected to one of the terminals of each of a set of five individual code setting contacts 41 and to the control grid of a relay puller tube 42. The output of the tube 42 operates a relay 43, preferably a polar relay which transmits negative and positive pulses to the line L in accordance with the operation of the relay. The other terminals of the code contacts 41 are individually connected through diodes 44 to the targets 24 of tube positions "2" to "6" of the tube 13. The code contacts 41 are permutatively set in open and closed positions in accordance with the code combination of intelligence pulses to be transmitted, and may for example be transmitting contacts of a tape transmitter, contacts of a rotary switch, or other suitable contacts. A magnet 46 operated by a relay 47 which is pulsed from a relay puller tube 48 normally changes the setting of the contacts for each cycle of operation.

The beam of the tube 13 or the "count" is advanced along the sections thereof by the action of a dual section flip-flop driver tube 49, the two outputs of the plates thereof being supplied to switching grids 26 with the signal from the right hand plate of tube 49 being applied simultaneously to the grids 26 of the even-numbered positions and that from the left hand plate being applied simultaneously to the grids of the odd-numbered positions.

The flip-flop driver tube 49 receives its control signal from an astable gated multivibrator tube 51 and is arranged to operate at one-half the frequency thereof.

In the embodiment of the invention as shown in the drawings, the frequency of the astable multivibrator tube 51 is stabilized by the output from a tube 52 controlled by an oscillator tube 53. For a speed of 100 words per minute (600 code groups) or 10 code groups per second, the oscillator tube 53 may operate, for example, at 300 cycles per second and stabilize the multivibrator operating at 75 cycles. The stabilizing oscillator may be used in the above manner when the rest pulse terminating each code group is one and a half times the length of the start and intelligence pulses, or where the code with five intelligence pulses is known as 7.5-unit code. When an odd code such as a 7.42-unit one is to be used, the oscillator output is disconnected from the multivibrator tube 51 and its operation is controlled in a manner hereinafter described to give the desired odd code. Changing the value of the oscillator capacitors 54, 55 and 56 will change the frequency thereof to enable the distributor to operate at other speeds. On the timing diagram, Fig. 2, the wave forms 57 and 58 represent the outputs of the oscillator 53 and multivibrator 51 respectively.

It will be assumed that the output of the flip-flop driver tube 49 is causing the beam of tube 13 to be advanced from left to right along the positions thereof and upon reaching the "7" position target a negative pulse is produced which is applied to a one-shot multivibrator tube 59. This negative pulse is represented on the timing diagram, Fig. 2, by curve 61 and it triggers tube 59 into its abnormal state. Tube 59 thereupon produces a positive pulse such as that of curve 62, Fig. 2, which is applied to the right hand control grid of an "or gate" tube 63. A variable resistor 64 in the control circuits of the one-shot multivibrator tube 59 enables the abnormal period of the tube to be varied, and for a so-called even code such as a seven and a half unit code, the period of the one-shot tube 59 is set to one time unit, or for a time equal to the length of one code element or intelligence pulse.

The cathodes of tube 63 are connected to the cathode of the right hand section of the astable gated multivibrator tube 51 and therefore the latter tube is stopped for a time interval equal to the abnormal period of the one-shot tube 59. At the end of this period the left hand section of the gate or tube 63 is activated, and through the circuit connections shown in the drawings it causes the beam of the counter tube 13 to be reset to the "0" target. At this same instant the astable multivibrator tube 51 turns on, and one-half the length of a code pulse later the flip-flop driver tube 49 is switched, which causes the beam to move from target "0" to target "1." Thus the beam of the counter tube 13 remains in the "0" target for a period of time equal to one-half the period it remains on each of the other targets "1" to "7." While the beam of the counter tube is on target "7" and target "0," the output of tube 13 is such that the tube 42 and polar relay 43 are invariably operated to cause a marking rest pulse to be transmitted to the line L. The length of the rest pulse is represented by the combined pulse lengths of wave forms 66 and 67, Fig. 2.

The next pulse from the flip-flop driver tube 49 advances the beam of tube 13 from target "1" to target "2" and since the normal operation of the astable multivibrator tube 51 and flip-flop driver tube are not disturbed at this time, the following pulse from the driver which advances the beam to target "2" will occur one cycle or the length of one code signal later. While the beam is on target "1" the output of tube 13 controls tube 42 and relay 43 to invariably transmit to line L a spacing start pulse represented by wave form 68 since none of target "1" current passes through output resistor 37.

Figure 2:
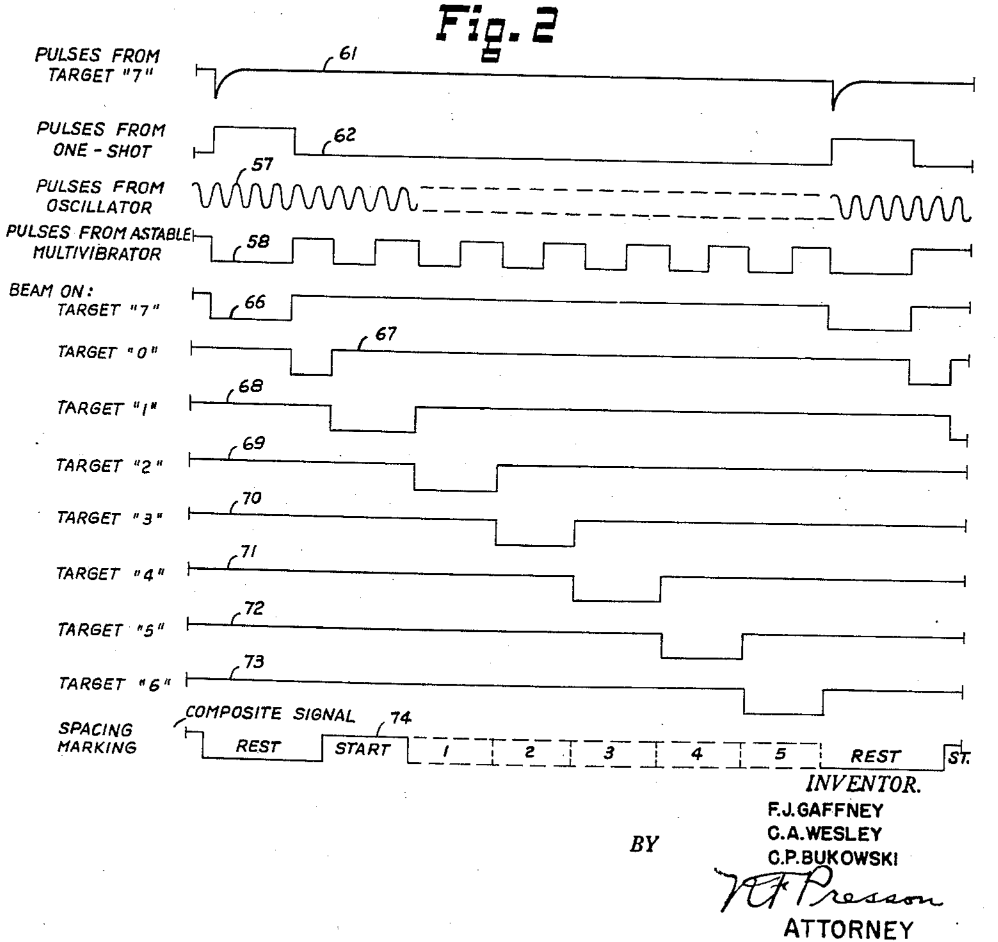
Fig. 2 is a timing diagram indicating the lengths of various signals in the circuits.

Following pulses from the flip-flop driver 49 continue to advance the beam along the positions "2" to "6" of the tube 13 with the beam remaining on each target for a period equal to the length of one code signal, such lengths being represented by the wave forms 69, 70, 71, 72 and 73, Fig. 2. The output of tube 13 while the beam is on targets of positions "2" to "6" is determined by the open and closed condition of the respective sets of contacts 41, which in turn control the tube 42 and relay 43 to transmit marking and spacing signals to the line. Wave form 74 indicates the composite code group of signals where each group of the five variable spacing and marking intelligence pulses (shown dotted) are preceded by an equal length spacing start pulse and terminated by a marking rest pulse one and a half times as long as the other pulses. Such codes are known as seven and a half unit codes, and by employing a different number of positions of tube 13 as intelligence signal positions, different codes such as a six and a half, an eight and a half, or a nine and a half code could be generated. Furthermore, by disconnecting the output of the oscillator controlled tube 52 from the astable multivibrator and changing the period of the one-shot tube 59 by means of the variable resistor 64, a so-called odd unit code can be generated such as a 7.42 unit code.

If for some reason the beam of the tube 13 should fail to be reset, an automatic resetting means is provided consisting of a thyratron tube 76 and associated circuitry. If the signal from the one-shot tube 59 should fail, the thyratron will fire within a predetermined length of time, which may be approximately one second due to the discharge of its cathode capacitor 77. When the thyratron fires, its output resets the beam of the tube 13 to the "0" position.

At the end of a message the input connector has positive potential applied thereto through contacts 20 which close only at the end of a message and remain closed until such time as it is desired to send another message. This positive potential turns the left hand section of the "or gate" tube 63 on and raises the potential on the cathodes of both sections of the tube and makes the left hand side of the tube conducting as well as raising the potential on the right hand section of the astable multivibrator tube 51, which stops the multivibrator. The tubes 63 and 51 remain in this state until the next message starts by opening the contacts 20.

While the invention has been shown and described in its preferred form, it will of course be understood that various modifications may be made therein without departing from the invention. The appended claims are therefore intended to cover any such modification within the true spirit and scope of the invention.

What is claimed is:

1. Apparatus for converting a simultaneous permutation-type code signal to a corresponding serial permutation-type code signal for transmission over telegraph lines and the like, comprising, in combination: a magnetron beam switching tube having a cathode and a plurality of count positions each including a control grid and a target adapted to establish a beam of current with said cathode; pulse-generating means coupled to said control grids to apply thereto a series of sequential pulses for advancing the beam of said tube along said count positions; a plurality of two-terminal switch means, one for each of said beam tube count positions, with said switch means being operable into any permuted combination of conducting or non-conducting condition in accordance with a particular code signal to be transmitted; first circuit means connecting one terminal of each switch means to a respective one of said beam tube targets, second circuit means connecting the other switch means terminals together to form a common output circuit; a source of potential for producing current flow through any of said beam tube count positions; a load element connected between said common switch means output circuit and said source of potential to develop a flow of current through said load element whenever the beam of said switching tube has been advanced by said pulse-generating means to a count position where the corresponding one of said switches is conditioned to conduct current, thereby to produce a change in voltage drop across said load element when said beam reaches such a count position; and voltage-responsive relay means connected to said common load element to produce an output pulse corresponding to each such change in voltage drop across said load element, and thus to develop, as the beam of said switching tube advances along said count positions, a serial permutation-type output signal corresponding to the particular permutation code established by the setting of said two-terminal switch means.

2. Apparatus as claimed in claim 1, wherein said beam switching tube includes a rest position at the end of said count positions; and a time-delay circuit operable by the beam current of said switching tube when the beam has been advanced to said rest position, said time-delay circuit including means to disable said pulse-generating means for a predetermined period of time after the beam reaches said rest position.

3. Apparatus as claimed in claim 2, wherein said time-delay circuit comprises a one-shot multivibrator including adjustable circuit means for varying the length of time of its output pulse, whereby to permit changing the time period during which said pulse-generating means is disabled.

References Cited in the file of this patent

UNITED STATES PATENTS

| | | |
|---|---|---|
| 2,682,574 | Canfora et al. | June 29, 1954 |
| 2,787,657 | Terry et al. | Apr. 2, 1957 |
| 2,793,318 | Seif | May 21, 1957 |

FOREIGN PATENTS

| | | |
|---|---|---|
| 148,489 | Australia | Oct. 1, 1952 |